US009760748B2

(12) United States Patent
Iannotti et al.

(10) Patent No.: US 9,760,748 B2
(45) Date of Patent: Sep. 12, 2017

(54) CALIBRATION CIRCUIT AND METHOD OF USE

(71) Applicant: General Electric Company, Schenectady, NY (US)

(72) Inventors: Joseph Alfred Iannotti, Niskayuna, NY (US); William Chester Platt, Niskayuna, NY (US); Trang Thuy Thai, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/820,736

(22) Filed: Aug. 7, 2015

(65) Prior Publication Data

US 2017/0039402 A1    Feb. 9, 2017

(51) Int. Cl.
| | |
|---|---|
| *G06K 7/10* | (2006.01) |
| *G01R 35/00* | (2006.01) |
| *F01D 11/14* | (2006.01) |
| *F01D 21/04* | (2006.01) |
| *G01B 7/14* | (2006.01) |
| *G01L 5/00* | (2006.01) |
| *H04Q 9/02* | (2006.01) |

(52) U.S. Cl.
CPC .......... *G06K 7/10198* (2013.01); *F01D 11/14* (2013.01); *F01D 21/04* (2013.01); *G01B 7/14* (2013.01); *G01L 5/00* (2013.01); *G01R 35/005* (2013.01); *G06K 7/10207* (2013.01); *H04Q 9/02* (2013.01); *G06K 7/10217* (2013.01)

(58) Field of Classification Search
CPC ......... G06K 19/0724; G06K 19/07767; G06K 7/10198; G06K 7/10107; G06K 7/10217; H01Q 1/2225; H01Q 1/248; H01Q 21/30; H04L 41/12; H04W 24/02; G01R 35/005; F01D 11/14; F01D 21/04; F01D 21/003; G01B 7/14
USPC ........... 340/10.2, 10.1, 10.5, 572.1; 702/107, 702/104; 324/662, 644
See application file for complete search history.

(56) References Cited

U.S. PATENT DOCUMENTS

| | | | |
|---|---|---|---|
| 7,439,864 B2 | 10/2008 | Hunt et al. | |
| 7,911,345 B2 | 3/2011 | Potyrailo et al. | |

(Continued)

FOREIGN PATENT DOCUMENTS

EP    2211139 A1    7/2010

OTHER PUBLICATIONS

European Search Report and Written Opinion issued in connection with corresponding EP Application No. 16181271.4 dated Nov. 29, 2016.

*Primary Examiner* — Ali Neyzari
(74) *Attorney, Agent, or Firm* — Nitin N. Joshi

(57) ABSTRACT

A calibration circuit includes a single-wire memory and a transmission line. The single-wire memory includes a power/interrogation terminal and a ground terminal. The single-wire memory is configured to store calibration data for a sensor. The transmission line is configured to be coupled between the sensor and a sensor reader. The transmission line includes first and second conductors. The first conductor is coupled to the power/interrogation terminal and is configured to provide the calibration data and a sensor output signal to the sensor reader. The second conductor is coupled to the ground terminal and is configured to provide a ground reference for the first conductor, the single-wire memory, and the sensor.

17 Claims, 4 Drawing Sheets

(56) References Cited

U.S. PATENT DOCUMENTS

| | | | | |
|---|---|---|---|---|
| 8,022,715 | B2* | 9/2011 | Andarawis | F01D 11/14 |
| | | | | 324/644 |
| 8,860,551 | B2* | 10/2014 | Carraher | H04L 41/12 |
| | | | | 340/10.1 |
| 8,988,223 | B2* | 3/2015 | Puleston | H04L 67/04 |
| | | | | 340/10.1 |
| 9,087,281 | B2* | 7/2015 | Maguire | G06K 19/0724 |
| 2008/0278288 | A1 | 11/2008 | O'Brien | |
| 2009/0204250 | A1 | 8/2009 | Potyrailo et al. | |
| 2010/0237994 | A1 | 9/2010 | Carraher et al. | |
| 2011/0285511 | A1 | 11/2011 | Maguire et al. | |
| 2011/0301903 | A1 | 12/2011 | Humbert et al. | |
| 2012/0068827 | A1 | 3/2012 | Yi et al. | |
| 2013/0176115 | A1 | 7/2013 | Puleston et al. | |
| 2015/0059461 | A1 | 3/2015 | Ingram et al. | |

\* cited by examiner

CALIBRATION CIRCUIT AND METHOD OF USE

BACKGROUND

The field of the disclosure relates generally to calibration circuits and, more particularly, to a calibration circuit having a single-wire memory device and a method of use thereof.

Many known radio frequency (RF) sensor systems operate using RF near-field coupling at frequencies ranging from 1 kilohertz (kHz) to 300 gigahertz (GHz). Such sensor systems typically include, for example, and without limitation, a first component in direct contact with an environment to be measured, and a second component not in direct contact with the environment. The first component typically includes a transducer component for sensing some aspect of the environment and an RF component for coupling to the second component. The second component typically includes an interface through which measurements are transmitted to an interrogator. The interrogator is any system suitable for reading an output signal from the sensor.

These known RF sensor systems typically utilize calibration data. Some known RF sensor systems provide calibration data using radio frequency identification (RFID) systems, where an RFID tag is placed on a particular component or machine. Certain other RF sensor systems provide calibration data through firmware updates, which generally entails a manual process. These known RF sensor systems are expensive and complex. In many cases, such as, for example, and without limitation, RF torque sensors, it is desirable for the calibration data to accompany a particular field-replaceable component rather than the interrogator, otherwise referred to as the sensor reader system. A calibration circuit is desirable that provides calibration data for an RF sensor in a cost-effective and non-complex manner, while facilitating the calibration data to accompany a particular component and be physically separated from the sensor reader system.

BRIEF DESCRIPTION

In one aspect, a calibration circuit is provided. The calibration circuit includes a single-wire memory and a transmission line. The single-wire memory includes a power/interrogation terminal and a ground terminal. The single-wire memory is configured to store calibration data for a sensor. The transmission line is configured to be coupled between the sensor and a sensor reader. The transmission line includes first and second conductors. The first conductor is coupled to the power/interrogation terminal and is configured to provide the calibration data and a sensor output signal to the sensor reader. The second conductor is coupled to the ground terminal and is configured to provide a ground reference for the first conductor, the single-wire memory, and the sensor.

In another aspect, a method of using a calibration circuit for a sensor is provided. The method includes generating a sensor output signal indicative of a measured environmental parameter. The method further includes transmitting the sensor output signal on a single conductor transmission line from the sensor toward a sensor reader. The method further includes powering a single-wire memory over the single conductor transmission line. The method further includes interrogating the single-wire memory over the single conductor transmission line.

In yet another aspect, a radio frequency (RF) sensor system is provided. The RF sensor system includes an RF sensor, a sensor reader, a transmission line, and a single-wire memory. The RF sensor is configured to detect an environmental parameter and generate a sensor output signal indicative of the environmental parameter. The sensor reader is configured to receive the sensor output signal and calibration data for the RF sensor. The transmission line includes a single conductor coupled between the RF sensor and the sensor reader. The transmission line is configured to conduct the sensor output signal. The single-wire memory is coupled to the single conductor and is configured to store the calibration data and to transmit the calibration data on the single conductor upon interrogation by the sensor reader.

DRAWINGS

These and other features, aspects, and advantages of the present disclosure will become better understood when the following detailed description is read with reference to the accompanying drawings in which like characters represent like parts throughout the drawings, wherein.

Figure 1:
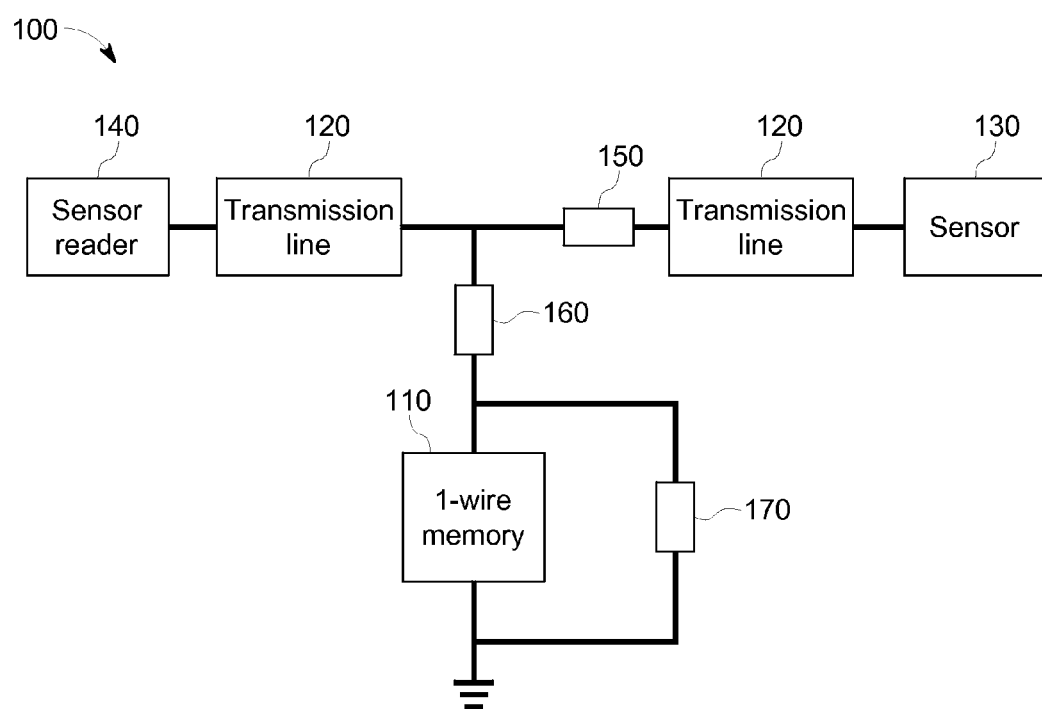
FIG. 1 is a block diagram of an exemplary calibration circuit.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, a number of terms are referenced that have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure relate to radio frequency (RF) calibration circuits. The RF calibration circuits described herein provide calibration data to a sensor reader system using low-complexity commercially available components that can withstand harsh environments frequently experienced in various industries, including, for example, and without limitation, oil and gas, water, power, and aviation. The RF calibration circuits described herein utilize a single-wire non-volatile memory that is integrated on an impedance-matched transmission line or connector. The RF calibration circuits described herein further facilitate the calibration data to accompany field-replaceable components and be physically separated from the sensor reader system.

Non-volatile memory includes, for example, and without limitation, electrically erasable programmable read-only memory (EEPROM), programmable read-only memory (PROM), erasable programmable read-only memory (EPROM), and ferroelectric random access memory (FRAM). Non-volatile memory is a non-transitory memory device frequently used in circuits for storing small amounts of data. Non-volatile memory maintains the stored data even while not powered. For example, and without limitation, certain EEPROM devices store calibration data, such as, coefficients, for example, for an RF sensor. Many non-volatile memory devices are powered via a power supply conductor, and data is retrieved via an interrogation conductor. Such devices generally also include a ground conductor. Single-wire memory devices utilize a single conductor for both power and interrogation. In RF sensors, the calibration circuit generally provides calibration data to the sensor reader system at power-on or during maintenance. This includes, for example, and without limitation, upon a daily power cycle, or when a field-replaceable component is replaced.

FIG. 1 is a block diagram of an exemplary calibration circuit 100. Calibration circuit 100 includes a single-wire memory 110 coupled to a transmission line 120. Transmission line 120 is coupled between a sensor 130 and a sensor reader 140. Sensor 130 includes any sensor suitable for measuring an environmental parameter or physical parameter of a machine, such as, for example, and without limitation a torque sensor for measuring strain on a drive shaft. In certain embodiments, sensor 130 includes, for example, and without limitation, an RF sensor that transmits a sensor output signal representing the measured parameter at frequencies of one megahertz or higher.

Transmission line 120 is a single conductor transmission line for conducting the sensor output signal from sensor 130 to sensor reader 140. In certain embodiments, where sensor 130 is an RF sensor, for example, transmission line 120 is an impedance-matched transmission line. An impedance-matched transmission line includes, for example, and without limitation, a coaxial cable for carrying RF signals. Certain transmission lines, for example, are suitable for RF signals having a frequency of at least one megahertz. Transmission line 120 includes a first conductor for carrying payload signals, such as, for example, the sensor output signal as well as a second conductor that provides a ground reference for the payload signals. In coaxial cables, the center conductor is the first conductor and the shielding is the second conductor and provides the ground reference.

Sensor reader 140 is configured to receive the sensor output signal from sensor 130 over transmission line 120. Sensor reader 140 uses calibration data to interpret the sensor output signal it receives. Calibration data generally includes, for example, and without limitation, coefficient values. The calibration data is stored on single-wire memory 110 and is retrieved using transmission line 120 through a process referred to as interrogation. During interrogation of single-wire memory 110, data is read and transmitted onto transmission line 120. Data is written to single-wire memory 110 through a process referred to as refresh. Data is generally written to single-wire memory 110 during manufacturer or by an original equipment manufacturer. In certain embodiments, single-wire memory 110 can be refreshed in the field using transmission line 120 and sensor reader 140.

Calibration circuit 100 also includes a capacitor 150 coupled in series on transmission line 120 between sensor 130 and single-wire memory 110. Transmission line 120 is generally a low-impedance transmission line. Capacitor 150 provides a high direct current (DC) impedance on transmission line 120, and further provides an RF short, i.e., a short circuit for RF signals. The high DC impedance operates to block DC signals on transmission line 120, including, for example, those originating at sensor reader 140 and single-wire memory 110. The high DC impedance provided by capacitor 150 further provides isolation of sensor 130 from such DC signals, while not impeding higher frequency signals, such as the sensor output signal from sensor 130.

Calibration circuit 100 further includes an inductor 160 coupled between transmission line 120 and single-wire memory 110. Inductor 160 provides a high-impedance path between transmission line 120 and single-wire memory 110, generally reducing the loading on transmission line 120 due to single-wire memory 110.

Calibration circuit 100 also includes a capacitor 170 coupled in parallel with single-wire memory 110. Capacitor 170 provides an RF short circuit across terminals of single-wire memory 110, thus preventing any voltage bias from being applied to single-wire memory 110 due to RF signals conducted on transmission line 120, including, for example, the sensor output signal. Calibration circuit 100 generally operates to read calibration data from single-wire memory 110 a fraction of the time spent conducting sensor output signals from sensor 130, through transmission line 120, and on to sensor reader 140. As such, capacitor 170 prevents high-frequency voltage from being applied to single-wire memory 110 over prolonged periods of time.

Figure 2:
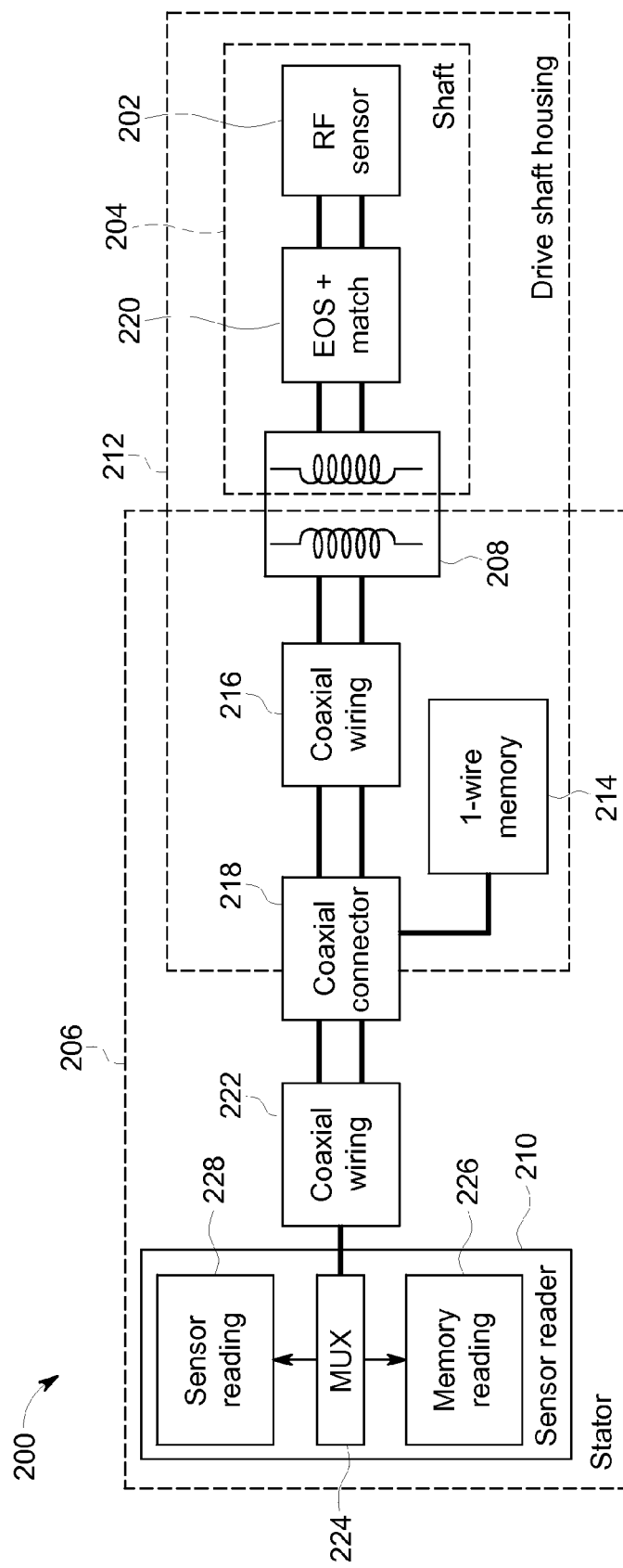
FIG. 2 is a block diagram of an exemplary RF sensor system in which the calibration circuit of FIG. 1 may be embodied.

FIG. 2 is a block diagram of an exemplary RF sensor system 200 in which calibration circuit 100 (shown in FIG. 1) may be embodied. RF sensor system 200 includes an RF sensor 202 coupled to a drive shaft 204 for measuring torque on drive shaft 204. RF sensor 202 on drive shaft 204 is coupled to a stator 206 through an RF coupler 208. RF sensor system 200 also includes a sensor reader 210 that receives an RF sensor output signal representing torque measured on drive shaft 204 by RF sensor 202.

RF sensor system 200 includes a drive shaft housing 212 that includes drive shaft 204, RF coupler 208, a single-wire memory 214, and a transmission line composed of coaxial wiring 216 and a coaxial connector 218. RF sensor 202 on drive shaft 204 is coupled to RF coupler 208 through an electrical over-stress (EOS) and impedance matching circuit 220. The RF sensor output signals from RF sensor 202 are coupled onto a center conductor (not shown) of coaxial wiring 216 through RF coupler 208. The RF sensor output signals are then transmitted from drive shaft housing 212 through coaxial connector 218 toward sensor reader 210.

Single-wire memory 214 is configured to store calibration data for RF sensor 202. During interrogation, the calibration data is read from single-wire memory 214 and transmitted onto coaxial wiring 222 through coaxial connector 218 and toward sensor reader 210. Drive shaft housing 212 includes RF sensor 202 and single-wire memory 214 containing the calibration data for RF sensor 202, all of which are separable from stator 206.

Sensor reader 210 is coupled to coaxial wiring 222 through a time multiplexor 224. Time multiplexor 224 facilitates calibration data signals and RF sensor output signals to be time-multiplexed on the transmission line formed between RF sensor 202 and sensor reader 210. During interrogation of single-wire memory 214, time multiplexor 224 directs calibration data signals from single-wire memory 214 to reach a memory reading module 226. Calibration data signals are typically transmitted below one megahertz. During sensor reading, time multiplexor 224 directs RF sensor output signals from RF sensor 202 to a sensor reading module 228.

Figure 3:
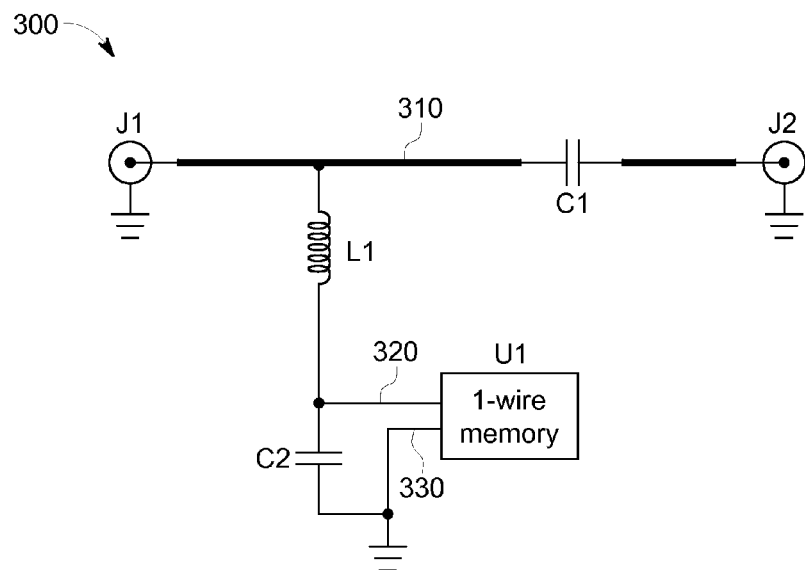
FIG. 3 is a schematic diagram of an exemplary calibration circuit, such as the calibration circuit shown in FIG. 1.

FIG. 3 is a schematic diagram of an exemplary calibration circuit 300, similar to calibration circuit 100 (shown in FIG. 1). Calibration circuit 300 includes a transmission line between a connector J1 and a connector J2. Connectors J1 and J2, in certain embodiments, are coaxial connectors having a center conductor and a ground reference conductor. Calibration circuit 300 includes a capacitor C1 that provides a high DC impedance to isolate connector J2 from DC signals on transmission line 310. Given this function, capacitor C1 is sometimes referred to as a DC blocking circuit. Capacitor C1 also provides an RF short, facilitating transmission of RF signals between connectors J1 and J2.

Calibration circuit 300 includes a single-wire memory U1 that includes a power/interrogation terminal 320 and a ground terminal 330. Ground terminal 330 is coupled to ground. Power/interrogation terminal 320 is coupled to transmission line 310 through an inductor L1. Inductor L1 provides a high impedance to reduce the loading effects of single-wire memory U1 on transmission line 310. Calibration circuit 300 includes a capacitor C2 coupled in parallel to single-wire memory U1 and across power/interrogation terminal 320 and ground terminal 330. Capacitor C2 provides an RF short circuit that prevents a voltage bias from being applied to single-wire memory U1 due to RF signals conducted on transmission line 310.

Single-wire memory U1 is configured to store calibration data for a sensor, such as sensor 130 (shown in FIG. 1) or RF sensor 202 (shown in FIG. 2), that is coupleable to transmission line 310 through connector J2. During interrogation, the calibration data is read from single-wire memory U1 and transmitted onto transmission line 310. Connector J1 is configured to be coupled to a sensor reader, such as sensor reader 140 (shown in FIG. 1) or sensor reader 210 (shown in FIG. 2). The sensor reader is configured to receive the calibration data from single-wire memory U1, as well as sensor output signals transmitted onto transmission line 310 through connector J2.

In one embodiment, a sensor (not shown) coupled to connector J2 is configured to transmit a sensor output signal having a frequency of 400 megahertz. A sensor reader (not shown) receives the sensor output signal through connector J1. In this embodiment, single-wire memory U1 is configured to operate at frequencies below one megahertz. Capacitors C1 and C2 are configured to provide an RF short for at least the 400 megahertz signals generated by the sensor, and each have a value of 330 picofarads. Inductor L1 is configured to provide a high impedance and has a value of 390 nanohenrys.

Figure 4:
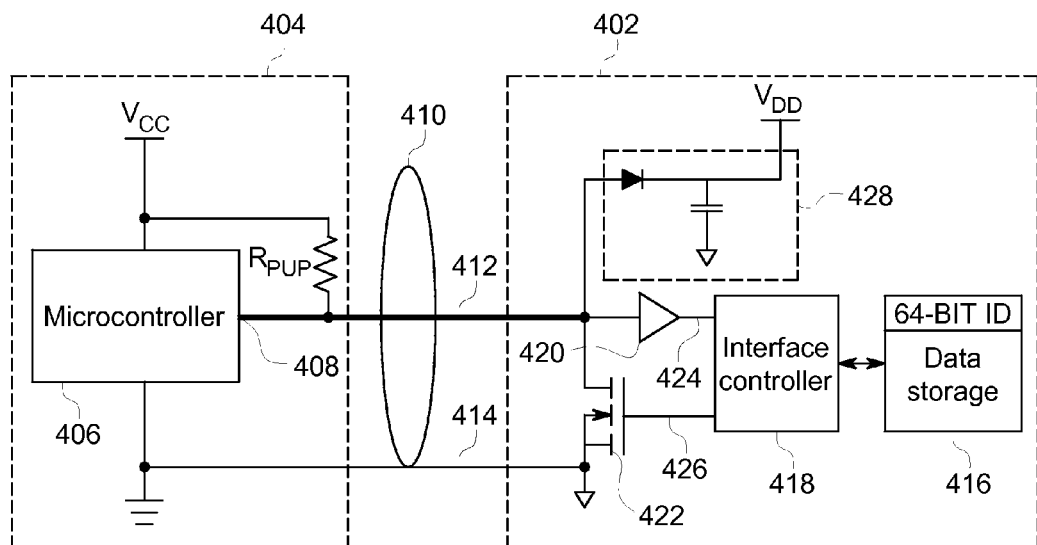
FIG. 4 is a schematic diagram of an exemplary single-wire memory and reader circuit for use in the calibration circuits shown in FIGS. 1 and 3, and in the RF sensor system shown in FIG. 2.

FIG. 4 is a schematic diagram of an exemplary single-wire memory 402 and memory reader 404 for use in calibration circuits, such as calibration circuits 100 and 300 (shown in FIGS. 1 and 3, respectively), and in RF sensor systems, such as RF sensor system 200 (shown in FIG. 2).

Memory reader 404 includes a microcontroller 406 coupled to a voltage $V_{CC}$ and ground. Microcontroller 406 also includes an input/output (I/O) terminal 408 operable as an open-collector. I/O terminal 408 is pulled up to voltage $V_{CC}$ through a pull-up resistor $R_{PUP}$. Microcontroller 406 is configured to receive calibration data from single-wire memory 402 through I/O terminal 408. In certain embodiments, microcontroller 406 is further configured to write to single-wire memory 402 through I/O terminal 408 using a refresh procedure.

Microcontroller 406 is coupled to single-wire memory 402 by a transmission line 410. Transmission line 410 includes a first conductor 412 for carrying signals, including, for example, and without limitation, sensor output signals and calibration data signals. Transmission line 410 further includes a second conductor 414 that provides a reference ground to first conductor 412. Second conductor 414 is coupled to ground at memory reader 404 and at single wire memory 402. In certain embodiments, transmission line 410 includes a coaxial wire, where first conductor 412 is a center conductor and second conductor 414 is a shielding conductor.

Single-wire memory 402 includes a data storage device 416 accessible through an interface controller 418. First conductor 412 of transmission line 410 couples to interface controller 418 through a buffer-amplifier 420 and a field effect transistor (FET) 422. Write data 424 passed through buffer-amplifier 420 is stored on data storage device 416 during a refresh procedure. Read data 426 is read from data storage 416 through FET 422 during interrogation.

Certain memory devices utilize a power supply conductor distinct from an interrogation conductor, in addition to a ground conductor. In other memory devices, referred to as single-wire memory, a single conductor provides power and data retrieval. Such a device further includes a ground conductor. Single-wire memory 402 further includes a parasitic power supply 428 coupled to first conductor 412 of transmission line 410 and providing an internal voltage $V_{DD}$.

Figure 5:
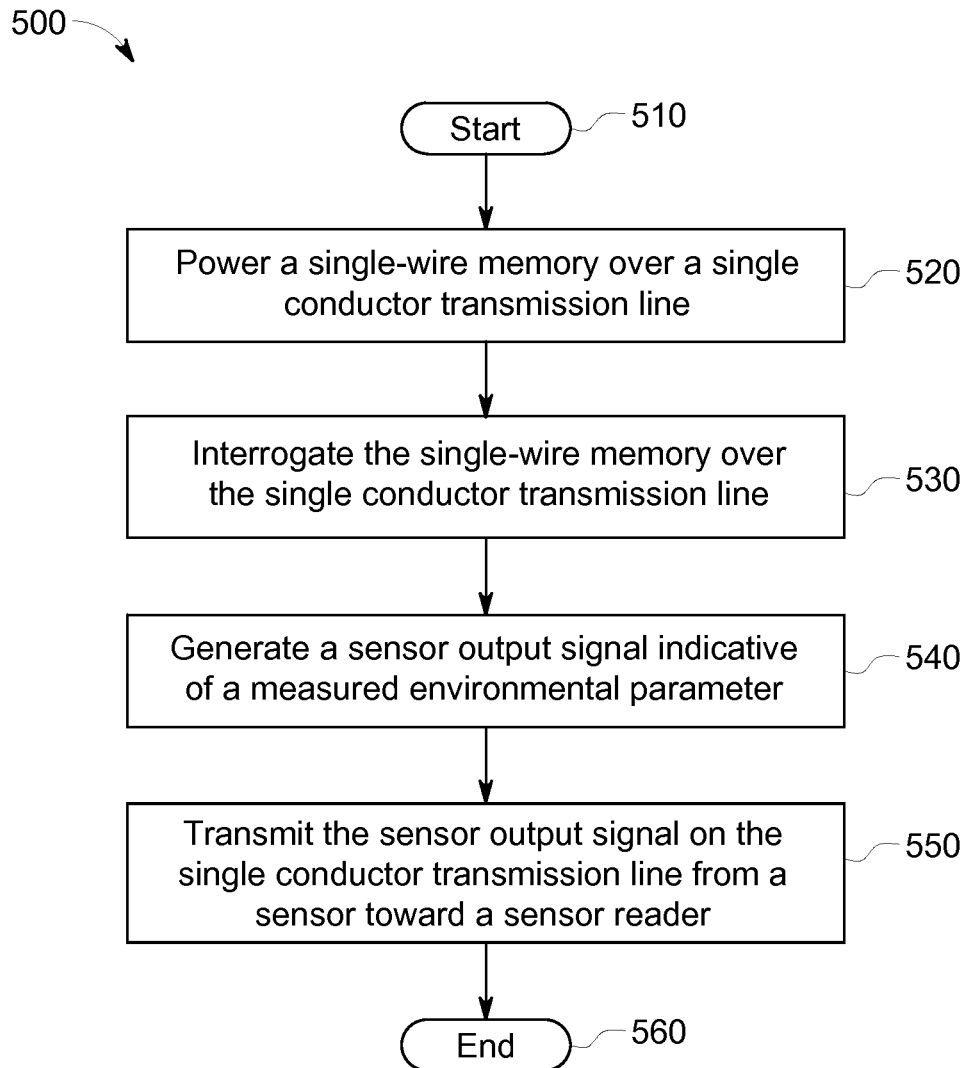
FIG. 5 is a flow diagram of an exemplary method of using a calibration circuit, such as the calibration circuits shown in FIGS. 1 and 3.

FIG. 5 is a flow diagram of an exemplary method 500 of using a calibration circuit, such as calibration circuits 100 and 300 (shown in FIGS. 1 and 3). Method 500 beings at a start step 510. Referring to FIGS. 1, 2, and 5, at a power step 520, single-wire memory 110 is powered over transmission line 120. Single-wire memory 110 is also interrogated over transmission line 120 at an interrogation step 530. During interrogation step 530, sensor reader 140 retrieves the calibration data from single-wire memory 110.

Calibration data from single-wire memory 110 is loaded into sensor reader 140. Referring to FIG. 2, the calibration data is loaded to sensor reading module 228 and memory reading module 226 is disconnected from transmission line 120 by time multiplexor 224, or is powered off.

At a generation step 540, sensor 130 generates a sensor output signal. The sensor output signal is indicative of a measured parameter, such as, for example, and without limitation, an environmental parameter or physical parameter of a machine. Sensor 130 transmits the sensor output signal onto transmission line 120 at a transmission step 550. The sensor output signal is transmitted through transmission line 120 toward sensor reader 140 and sensor reading module 228. Sensor reader 140 is configured to receive the sensor output signal and use it based on calibration data for sensor 130 to generate a calibrated output parameter, such as, for example, and without limitation, torque and temperature. The method then ends at an end step 560.

The above described RF calibration circuits provide calibration data to a sensor reader system using low-complexity commercially available components that can withstand harsh environments frequently experienced in various industries, including, for example, and without limitation, oil and gas, water, power, and aviation. The RF calibration circuits described herein utilize a single-wire memory that is integrated on an impedance-matched transmission line or connector. The RF calibration circuits described herein further facilitate the calibration data to accompany field-replaceable components and be physically separated from the sensor reader system.

An exemplary technical effect of the methods, systems, and apparatus described herein includes at least one of: (a) simplifying calibration circuits through use of single-wire memory; (b) simplifying manufacturing of the simplified calibration circuit; (c) reducing costs through simplification of the calibration circuit and use of commercially available components; (d) improving reliability through use of commercially available components that can withstand harsh environments, such as high temperatures; (e) increasing memory capacity over RFID alternatives; (f) improving signal-to-noise ratio of RF sensors through use of controlled high output impedance; and (g) improving passive isolation of high-frequency analog RF signals of the sensor and DC low-frequency digital signals of the single-wire memory.

Exemplary embodiments of methods, systems, and apparatus for RF calibration circuits are not limited to the specific embodiments described herein, but rather, components of systems and/or steps of the methods may be utilized independently and separately from other components and/or steps described herein. For example, the methods may also be used in combination with other non-conventional RF calibration circuits, and are not limited to practice with only the systems and methods as described herein. Rather, the exemplary embodiment can be implemented and utilized in connection with many other applications, equipment, and systems that may benefit from reduced cost, reduced complexity, commercial availability, improved reliability at high temperatures, and increased memory capacity.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A calibration circuit, comprising:
   a single-wire memory comprising a power/interrogation terminal and a ground terminal, said single-wire memory configured to store calibration data for a sensor;
   a transmission line configured to be coupled between the sensor and a sensor reader, said transmission line comprising:
   a first conductor coupled to said power/interrogation terminal and configured to provide the calibration data and a sensor output signal to the sensor reader; and
   a second conductor coupled to said ground terminal and configured to provide a ground reference for said first conductor, said single-wire memory, and the sensor; and
   an inductor coupled in series between said first conductor and said power/interrogation terminal, said inductor configured to provide a high impedance path from the sensor to said single-wire memory for the sensor output signal.

2. The calibration circuit in accordance with claim 1, wherein said transmission line comprises an impedance-matched radio frequency (RF) transmission line.

3. The calibration circuit in accordance with claim 2, wherein said impedance-matched RF transmission line is configured to conduct transmissions of at least one megahertz.

4. The calibration circuit in accordance with claim 3, wherein said single-wire memory comprising a non-volatile electrically erasable programmable read-only memory (EEPROM) configured to operate at frequencies below one megahertz.

5. The calibration circuit in accordance with claim 1 further comprising a capacitor coupled in parallel with said power/interrogation terminal and said ground terminal, said capacitor configured to prevent a voltage bias across said power/interrogation terminal and said ground terminal when the sensor output signal is applied.

6. The calibration circuit in accordance with claim 1 further comprising a capacitor coupled to said first conductor, in series, and between said power/interrogation terminal and the sensor, said capacitor configured to prevent said first conductor from operating as a direct current (DC) impedance within the range of 0 to 100 ohms, inclusively.

7. A method of using a calibration circuit for a sensor, said method comprising:
   powering a single-wire memory over a single conductor transmission line;
   interrogating the single-wire memory over the single conductor transmission line;
   generating a sensor output signal indicative of a measured parameter;
   transmitting the sensor output signal on the single conductor transmission line from the sensor toward a sensor reader;
   wherein transmitting the sensor output signal further comprises:
   creating an RF high impedance path from the single conductor transmission line to the single-wire memory; and
   creating an RF short circuit across power/interrogation and ground terminals of the single-wire memory.

8. The method in accordance with claim 7, wherein transmitting the sensor output signal comprises transmitting a radio frequency (RF) signal having a frequency of at least one megahertz.

9. The method in accordance with claim 8, wherein interrogating the single-wire memory comprises transmitting a calibration signal having a frequency below one megahertz toward the sensor reader, the calibration signal representing calibration data for the sensor.

10. The method in accordance with claim 9, wherein interrogating the single-wire memory further comprises creating an RF short and direct current (DC) blocking circuit on the single conductor transmission line between the single-wire memory and the sensor.

11. The method in accordance with claim 7 further comprising time-multiplexing transmitting the sensor output signal and interrogating the single-wire memory on the single conductor transmission line.

12. A radio frequency (RF) sensor system comprising:
an RF sensor configured to detect at least one of an environmental parameter and a physical parameter and generate a sensor output signal indicative thereof;
a sensor reader configured to receive the sensor output signal and calibration data for said RF sensor;
a transmission line comprising a single conductor coupled between said RF sensor and said sensor reader, said transmission line configured to conduct the sensor output signal;
a single-wire memory coupled to said single conductor and configured to:
store the calibration data; and
transmit the calibration data on said single conductor upon interrogation by said sensor reader; and
an inductor coupled between said single conductor and a power/interrogation terminal of said single-wire memory, said inductor configured to reduce loading on said transmission line.

13. The RF sensor system in accordance with claim 12, wherein said RF sensor comprises a torque sensor configured to be coupled to a drive shaft for measuring strain.

14. The RF sensor system in accordance with claim 13 further comprising an RF coupling circuit configured to couple the sensor output signal from said RF sensor onto said transmission line.

15. The RF sensor system in accordance with claim 12, wherein said sensor reader comprises:
a sensor reading module for receiving the sensor output signal;
a memory reading module for receiving the calibration data; and
a time-multiplexer configured to time-multiplex the sensor output signal and the calibration data on said transmission line.

16. The RF sensor system in accordance with claim 12 further comprising a first capacitor coupled between said RF sensor and said single-wire memory on said transmission line, said first capacitor configured to provide an RF short and a DC block on said transmission line.

17. The RF sensor system in accordance with claim 16 further comprising a second capacitor coupled between a ground reference and the power/interrogation terminal of said single-wire memory, said power/interrogation terminal coupled to said single conductor, said second capacitor configured to provide an RF short to prevent a voltage bias across said ground reference and said power/interrogation terminal due to the sensor output signal.

* * * * *